United States Patent
Wager et al.

(10) Patent No.: US 10,120,771 B2
(45) Date of Patent: Nov. 6, 2018

(54) MULTIUSE-CAPABLE TEST ENVIRONMENT FOR A PLURALITY OF TEST OBJECTS

(71) Applicant: EADS DEUTSCHLAND GMBH, Ottobrunn (DE)

(72) Inventors: Philipp Wager, Landshut (DE); Bernd Schumacher, Ingolstadt (DE)

(73) Assignee: Airbus Defence and Space GmbH, Ottobrunn (DE)

( * ) Notice: Subject to any disclaimer, the term of this patent is extended or adjusted under 35 U.S.C. 154(b) by 147 days.

(21) Appl. No.: 14/783,405

(22) PCT Filed: Apr. 4, 2014

(86) PCT No.: PCT/DE2014/000169
§ 371 (c)(1),
(2) Date: Oct. 8, 2015

(87) PCT Pub. No.: WO2014/166470
PCT Pub. Date: Oct. 16, 2014

(65) Prior Publication Data
US 2016/0070631 A1    Mar. 10, 2016

(30) Foreign Application Priority Data

Apr. 9, 2013    (DE) .................. 10 2013 006 012

(51) Int. Cl.
*G06F 11/273*    (2006.01)
*G06F 11/30*    (2006.01)
(Continued)

(52) U.S. Cl.
CPC ...... *G06F 11/3041* (2013.01); *G01R 31/2834* (2013.01); *G01R 31/31903* (2013.01);
(Continued)

(58) Field of Classification Search
CPC .... G06F 11/3664; G06F 11/273; G06F 11/26; G01R 31/31907; G01R 31/2834; G01R 31/31903
See application file for complete search history.

(56) References Cited

U.S. PATENT DOCUMENTS

| 4,760,330 A | 7/1988 | Lias, Jr. |
| 7,210,087 B2 | 4/2007 | Mukai et al. |

(Continued)

FOREIGN PATENT DOCUMENTS

| DE | 60 2005 003 225 T2 | 8/2008 |
| GB | 2 005 848 A | 4/1979 |

OTHER PUBLICATIONS

International Search Report (PCT/ISA/210) issued in PCT Application No. PCT/DE2014/000169, dated Sep. 15, 2014 (Three (3) pages).

(Continued)

*Primary Examiner* — Yolanda L Wilson
(74) *Attorney, Agent, or Firm* — Crowell & Moring LLP

(57) ABSTRACT

The present invention relates to an arrangement for providing a test environment for testing test objects. The arrangement includes a first test case implementation unit and a second test case implementation unit, as well as a first test object and a second test object. In one embodiment, the test environment is configured such that at least the first test case implementation unit is coupled to at least one of the first test object and the second test object for implementing a test case.

13 Claims, 2 Drawing Sheets

(51) Int. Cl.
  *G01R 31/319* (2006.01)
  *G01R 31/28* (2006.01)
  *G06F 11/36* (2006.01)
(52) U.S. Cl.
  CPC ...... *G01R 31/31907* (2013.01); *G06F 11/273* (2013.01); *G06F 11/3664* (2013.01)

(56) References Cited

U.S. PATENT DOCUMENTS

| | | | | |
|---|---|---|---|---|
| 7,339,891 | B2* | 3/2008 | Binder | H04L 12/2697 |
| | | | | 370/231 |
| 9,015,654 | B2* | 4/2015 | Kaasila | G06F 11/3664 |
| | | | | 702/186 |
| 9,989,593 | B2* | 6/2018 | Wager | G01R 31/31907 |
| 2004/0210798 | A1* | 10/2004 | Higashi | G01R 31/31830 |
| | | | | 714/27 |
| 2004/0225459 | A1* | 11/2004 | Krishnaswamy | G01R 31/3183 |
| | | | | 702/57 |
| 2005/0262412 | A1* | 11/2005 | Mukai | G01R 31/31907 |
| | | | | 714/742 |
| 2007/0043458 | A1* | 2/2007 | Pinnegar | G01V 1/284 |
| | | | | 700/94 |
| 2010/0070255 | A1* | 3/2010 | Biltz | G06F 11/261 |
| | | | | 703/13 |
| 2011/0181309 | A1 | 7/2011 | Morita et al. | |

OTHER PUBLICATIONS

Rajsuman, "An Overview of the Open Architecture Test System", Electronic Design, Test and Applications, 2004. Delta 2004. Second IEEE International Workshop on Perth, Australia Jan. 28-30, 2004, Piscataway, NJ, USA, IEEE, Jan. 28, 2004 (Jan. 28, 2004), 6 pages, XP010778701.

* cited by examiner

MULTIUSE-CAPABLE TEST ENVIRONMENT FOR A PLURALITY OF TEST OBJECTS

FIELD OF THE INVENTION

The invention relates to a test environment for testing test objects that may be, for instance, a technical system, a subsystem of a technical system, or another technical component, and in particular a safety-related component, such as, e.g., a component of an aircraft or of an aircraft computer.

BACKGROUND OF THE INVENTION

After technical components are developed and prior to their use, they may need to be tested to determine how they behave in various situations. Such a test may comprise a plurality of test cases, wherein each test case has a set of input data and a set of expected output data. Simply put, the test object is acted upon with the input data and the reaction or behavior of the test object relative to these input data is measured. The data measured in this way are then compared to the expected output data associated with this test case. Agreement between the measured data and the expected output data indicates correct functioning of the test object in that specific test case. If the measured data deviate from the pre-specified and expected output data, this may indicate a malfunction of the test object.

In some circumstances, it may be necessary to adapt a test environment to a specific test object, whether this is related to the mechanical coupling of the test object to the test environment or is related to the signals coupling of the test object to the test environment for acting on the test object with the input data of a test case and for reading out the output data in connection with a test case.

A test case is normally started by a test case implementation unit and the implementation of the test case is monitored, wherein an individual test case implementation unit is prepared in order to implement test cases on the test object. If a new or variant test object is provided for testing in the test environment, it may be necessary to adapt the test environment to the variant test object.

SUMMARY OF THE INVENTION

Making possible enhanced economic utility of a test environment and selective access by a plurality of test case implementation units to one or a plurality of test objects may be considered an object of the invention.

In accordance with one aspect of the invention, a test environment for testing test objects is provided. The test environment has a first test case implementation unit and a second test case implementation unit and has a first test object and a second test object. The test environment is embodied such that at least one test case implementation unit of the first test case implementation unit and of the second test case implementation unit may be coupled to a test object of the first test object and of the second test object for implementing a test case.

Thus, it is made possible to couple a test case implementation unit alternatively to a first test object or to a second test object and to initiate a test case on the corresponding test object. The coupling of the test case implementation units and the test object may in particular occur such that a test object is subjected to at most one test case at a time. Conversely, the test case of the first test object and the test case of the second test object may be initiated by a test case implementation unit.

The coupling between one test case implementation unit and one test object is reversible, that is, after the implementation of a test case of the first test case implementation unit a test object may be decoupled from the first test case implementation unit and may be coupled to the second test case implementation unit for implementing another test case. In other words, this prevents a rigid coupling between a test object and a test case implementation unit and makes it possible to implement successively different and multiple test cases of different test case implementation units. The test case implementation units may also be spatially separated from the test object. This means that a test case is acted upon by remote access to the test object. The test case implementation units may also be spatially distributed such that they are in different time zones so that the most economic possible use is made of the test object and test environment and of the time available for implementing test cases.

The test environment as described above and in the following thus enables in particular the multiple use of a test case implementation unit and in addition makes available a multiuser-capable test environment, i.e. a plurality of users, who may be spatially or geographically distributed, may access one test object or even a plurality of different test objects.

In accordance with one embodiment, access by a test case implementation unit to a test object is possible independent of location and time. Being independent of location means that a test case implementation unit may access a test object from any desired location and in particular via remote access from a remote location. In particular, there may not be direct line-of-sight, e.g. for an operator of the test case implementation unit, between the test object and the remote location. Being independent of time means that a test object may be accessed by a test case implementation unit at any desired time.

In accordance with one embodiment, the test objects are spatially separated from one another.

This enables in particular the cooperation of a plurality of test objects that are spatially separated from one another in a common test scenario.

In accordance with one embodiment, the test environment is embodied such that the at least one test case implementation unit of the first test case implementation unit and of the second test case implementation unit may be coupled to the first test object and also to the second test object for implementing one test case each.

This means that one test case implementation unit may be coupled to more than one test object in order to initiate and implement a test case on each test object individually. The control and monitoring of the test cases or test objects may thereby occur concurrently or quasi-parallel using the one test case implementation unit. On the other hand, however, a test object may be coupled to at most one test case implementation unit at a time.

In accordance with another embodiment, the test environment has a third test object and is embodied such that the other test case implementation unit of the first test case implementation unit and of the second test case implementation unit may be coupled to the third test object for implementing a test case.

One test case implementation unit, especially the first test case implementation unit, may thus be coupled to the first test object and to the second test object, while the other test case implementation unit, especially the second test case implementation unit, may be coupled to the third test object. In this context, it should be noted that the test environment as described above and in the following permits one coupling each between a test case implementation unit and the test objects as long as one test object at a time implements at most one test case from one individual test case implementation unit.

In accordance with another embodiment of the invention, the test environment furthermore has a connection unit that is embodied to selectively couple the first test case implementation unit or the second test case implementation unit to the first test object and/or to the second test object.

The connection unit may be a control unit or a so-called multiplexer that has an input interface for connecting the test case implementation units and has an output interface for connecting the test objects.

The input interface has a plurality of connection elements, wherein each test case implementation unit is allocated to a connection element or is connected to this connection element. Similarly, the same applies to connecting the output interface to the test objects.

The connection unit makes it possible to implement or switch a connection element of the input interface to a connection element or a plurality of connection elements of the output interface so that the corresponding test case implementation unit is coupled to a test object or to a plurality of test objects via the connection unit.

In accordance with another embodiment of the invention, the test environment has a connection bus that is embodied to connect all test case implementation units to all test objects so that each test case implementation unit may be selectively coupled to each test object.

The connection bus thus initially provides only the opportunity to actually couple a test case implementation unit to a test object, wherein this coupling must occur independently and in addition to the provided connection of the test case implementation units to the test objects.

In one embodiment, the coupling between a test case implementation unit and a test object may occur both ways, specifically, via the connection unit and via the connection bus. This may in particular increase the reliability of the test environment or the reliability of the signal coupling between a test case implementation unit and a test object.

The connection bus may be a data transfer bus via which information is transmitted and addressed either to a test object or to a test case implementation unit. The connection bus may be any bus system that may be used in automation, especially under real-time requirements and furthermore especially under so-called soft real-time requirements. One example of such a bus is the so-called EtherCAT.

In accordance with another embodiment of the invention, the test environment furthermore has a plurality of simulation hardware units that are actuated by the test objects during a test case, wherein each of the plurality of simulation hardware units may be selectively coupled to a test object via the connection unit.

If a control or regulating unit is tested jointly or together with the controlled or regulated component, the control or regulating component, which is the test object, must also be given access to the controlled or regulated technical component, which is the simulation hardware unit. The simulation hardware unit may alternatively be a model of the controlled or regulated technical component that has the same behavior as the technical component to be controlled or regulated. For instance, the test object may be an aircraft computer and the simulation hardware unit may be a component of an aircraft that is monitored by this aircraft computer.

The test environment as described above and in the following may have a plurality of different simulation hardware units, wherein the coupling may occur between each test object and each simulation hardware unit. This coupling between the simulation hardware units and the test objects may in particular occur via the connection unit or via the connection bus.

In accordance with another embodiment of the invention, the test environment furthermore has a plurality of signal taps, of which one is allocated to each test object and is embodied to read out the data transmitted to the test object and output by the test object.

A signal tap can thus be used for analyzing the data output by the test object and for diagnostics and troubleshooting. Regardless of whether a test case implementation unit is present and how it functions, the data output by a test object may be read out via the signal tap and supplied to an additional evaluation element.

In accordance with another embodiment of the invention, at least one signal tap of the plurality of signal taps is embodied to be able to receive data that may be forwarded as an input signal to the test object allocated to this signal tap.

This means that not only can a signal tap read out data, but it may also input data, for instance from test cases or from faults or fault signals, in order to check the behavior of the test object when fault signals or disturbed signals are received. In addition, a test case may be initiated and implemented via the signal tap regardless of whether a test case implementation unit is present.

In accordance with another embodiment of the invention, the test environment furthermore has a control device that is embodied to control the coupling of the test case implementation units to the test objects and the coupling of the test objects to the simulation hardware units via the connection unit.

The control device therefore has the task of monitoring the test environment and all components of the test environment from a central position and coupling them to one another in accordance with a global test instruction.

The test environment, as described above and in the following, facilitates a modular structure and selective linking of test case implementation units, test objects, and simulation hardware units, so that in particular it is possible for a plurality of operators or testers to access one or a plurality of test objects, wherein at the same time the use of the test environment is made possible for a number of different test objects without the entire test environment having to be adapted to one test object. The connection unit has the task of producing a coupling between the different test objects and the test case implementation units.

Exemplary embodiments of the invention are described in the following, with reference to the figures.

DETAILED DESCRIPTION OF EXEMPLARY EMBODIMENTS

The representations in the figures are schematic and are not true to scale. When the same reference numbers are used in the following description of the figures, they refer to the same or similar elements.

Figure 1:
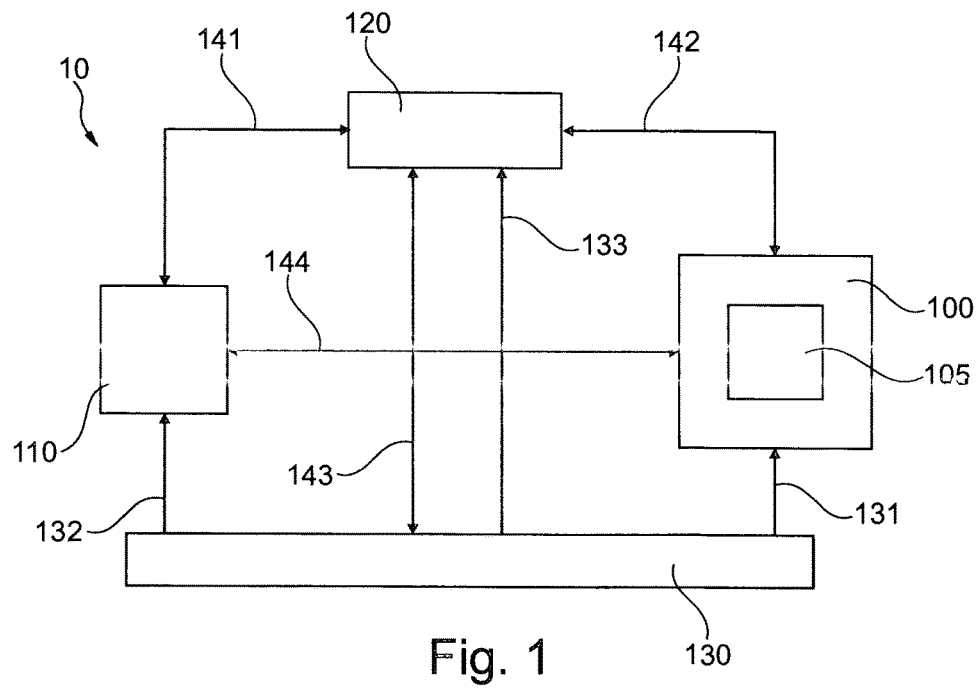
FIG. 1 is a schematic depiction of a test environment in accordance with one exemplary embodiment of the invention.

FIG. 1 depicts a test environment 10 having a test case implementation unit 110 and a test object 105 that is arranged in a test object receiving device 100. A control device 120 is provided for controlling the test case implementation unit 110 and for controlling the test object receiving device 100 and the test object 105. Likewise, the control device 120 controls an energy supply unit 130 that supplies the test case implementation unit 110, the test object receiving device 100, the test object 105 and the control device 120 with energy for implementing a test.

The unidirectional arrows 131, 132, 133 provide a schematic representation of the energy supply for the test object receiving device 100, test case implementation unit 110, and control device 120. The direction of the arrows indicates the direction in which the energy is being provided. The bidirectional arrows symbolize data connections between components. The control device 120 has a data connection 141 to the test case implementation unit 110, a data connection 142 to the test object receiving device 100 or to the test object 105 arranged therein, and a data connection 143 to the energy supply unit 130. The entire test environment or test scenario is controlled via these data connections.

In addition, there is another data connection 144 between the test case implementation unit 110 and the test object receiving device 100, wherein the actual test case is initiated and implemented using the test case implementation unit 110, and the output data for the test object 105 are received, via this data connection 144.

The test case implementation unit 110 is embodied to exchange data with the test object receiving device 100 via a pre-specified mechanical and electrical connection 144. These data are adapted to the interface of the test object 105 by the test object receiving device 100 so that with a new test object only the test object receiving device 100 must be adapted to the mechanical and electrical interface of the test object 105, wherein the connection to the test case implementation unit 110 may be retained both with respect to the mechanical and to the electrical interface. In other words, this involves so-called encapsulation of the mechanical, electrical, and signal interfaces of the test object 105 using the test object receiving device 100 so that when there is a new test object only the test object receiving device 100 is adapted to the test object, without also adapting the mechanical, electrical, and signal-transmission interfaces of the test object receiving device to the test case implementation unit. The designing and qualification of a test environment as a whole may thus be avoided to the greatest possible extent when a new test object is to be tested. So-called qualification of the test environment shall be construed to mean testing the test environment itself for correct functioning.

Figure 2:
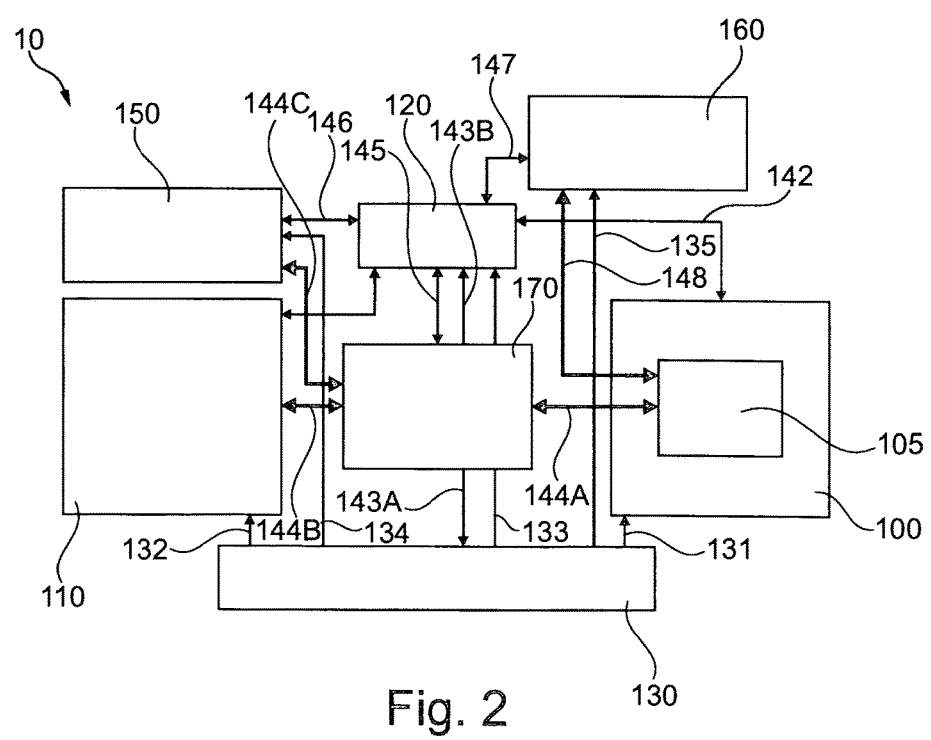
FIG. 2 is a schematic depiction of a test environment in accordance with another exemplary embodiment of the invention.

FIG. 2 depicts a test environment 10 that has, in addition to the components already depicted in FIG. 1, a simulation hardware unit 150, an input/output element 160, and a connection unit 170.

The connection unit 170 is embodied to couple the test case implementation unit 110, the simulation hardware unit 150, and the test object 105 disposed in the test object receiving device 100 to one another. The coupling between these components is controlled via the control device 120 and the data connection 145 between the control device 120 and the connection unit 170.

The input/output elements 160 provide for local control of the test object 105 via the data connection 148. The test object may, for instance, be turned on via the input/output elements 160, or in an emergency may be turned off or deactivated. Likewise, an operating mode of the test object could be specified via the elements 160.

In contrast to this control of the test object via the input/output elements 160, which are spatially near or even within line-of-sight of the test object 105, a test case may be initiated and implemented using the test case implementation unit 110 via the data connection 144A, 144B even using remote access. This means that the test case implementation unit 110 is arranged spatially separated from the test object and the connection is produced for instance via a public or private data network between the test object and the test case implementation unit.

Just as the test case implementation unit 110 may be arranged spatially separated from the test object 105, the simulation hardware unit 150 may also be arranged spatially separated from the test object 105. This facilitates for instance the joint use of a single available simulation hardware unit 150 by a plurality of different test objects 105, of which all may be located at different locations and may be placed independent of the simulation hardware unit 150.

Here, as well, it is clear that the test environment 10 as described above and in the following makes possible multiple use of components, for instance of the simulation hardware unit 150, as well as multiaccess of a test object sequentially by a plurality of users who are spatially separated from one another and from the test object.

Figure 3:
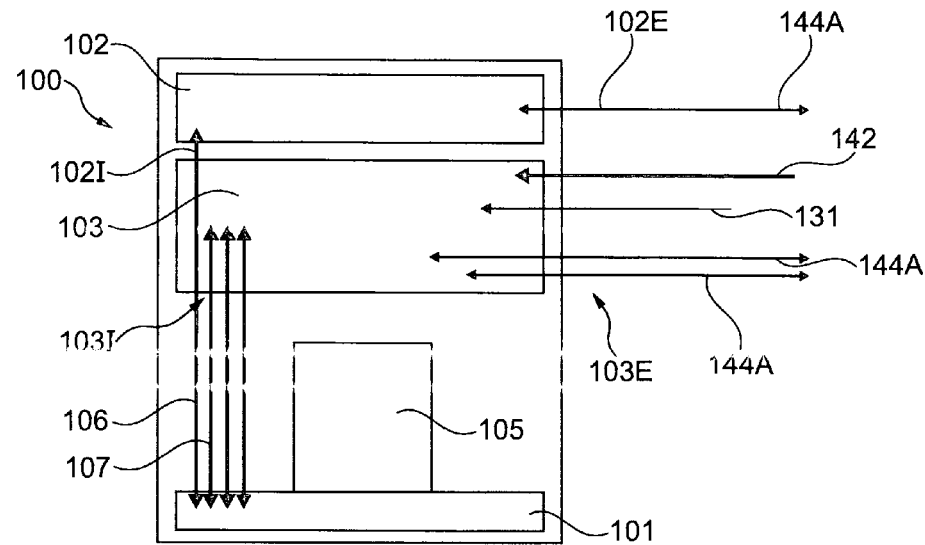
FIG. 3 is a schematic depiction of a test object receiving device for a test environment in accordance with another exemplary embodiment of the invention.

FIG. 3 depicts a test object receiving device 100 having a test object 105. The test object 105 is mechanically and electrically coupled to a receiving element 101. The receiving element 101 thus forms the interface of the test object receiving device to the test object 105 and is adapted to the mechanical, electrical, and signal-transmission requirements for connecting to the test object 105.

The test object receiving device 100 also has another test signal interface unit 102 and a signal interface unit 103. The signal interface unit 103 is embodied for receiving via an internal interface 1031 signals from the test object 105 via the receiving element 101, processing or converting these signals, and outputting them via an external interface 103E to the connection unit 170 via the data connection 144A. The signals of the test object are transmitted from the receiving element 101 via a data connection 107 to the signal interface unit 103.

Optionally, the test object receiving device 100 may have a test signal interface unit 102 that receives via an internal interface 1021 signals from the receiving element 101 via the data connection 106, evaluates and where necessary converts these signals, and outputs them via the external interface 102E and the data connection 144A.

The test signal interface unit 102 is optional and makes it possible to connect a diagnostics unit to the test object receiving device, wherein the diagnostics unit evaluates and analyzes test signals of the test object.

Moreover, the signal interface unit 103 is connected to the energy supply unit 130 via the line 131 and to the control device 120 via the data connection 142.

In one exemplary embodiment, the test object receiving device 100 may be a closed unit for operating the test object 105 embedded therein. The receiving element or the interface for connecting the test object provides for the mechanical, electrical, and signal transmission adaptation or coupling of the test object. In addition, the receiving element 101 may include other functions, such as, for instance, a cooling function, to remove heat that occurs when the test object is operated. The test object is mounted on or attached to the receiving element and the interfaces of the test object are transmitted by the receiving element via the data connections 106, 107 to the test signal interface unit 102 or to the signal interface unit 103. The test object 105 may also have diagnostics or programming interface connections in addition to operation interface connections. The operation interfaces are connected discretely to the signal interface unit and the diagnostics or programming interfaces are connected discretely to the test signal interface unit 102. The test signal interface unit is optional and is used, for instance, for troubleshooting or may be used for importing control programs into the test object. The signal interface unit 103 guides all operation interface connections of the test object outward out of the test object receiving device 100 via the external interface 103E. This guiding of the interfaces of the test object out of the test object receiving device may be discretely wired, for instance via standard plugs, and may also be done using logic via a bus system. Being discretely wired means that a physical line is also allocated to a signal line, and, in contrast thereto, in a logical connection a plurality of connections are guided via a common physical line. In one exemplary embodiment, a logical connection may involve signal conversion, for instance with a change in the signal coding or even with an analog/digital converter.

Figure 4:
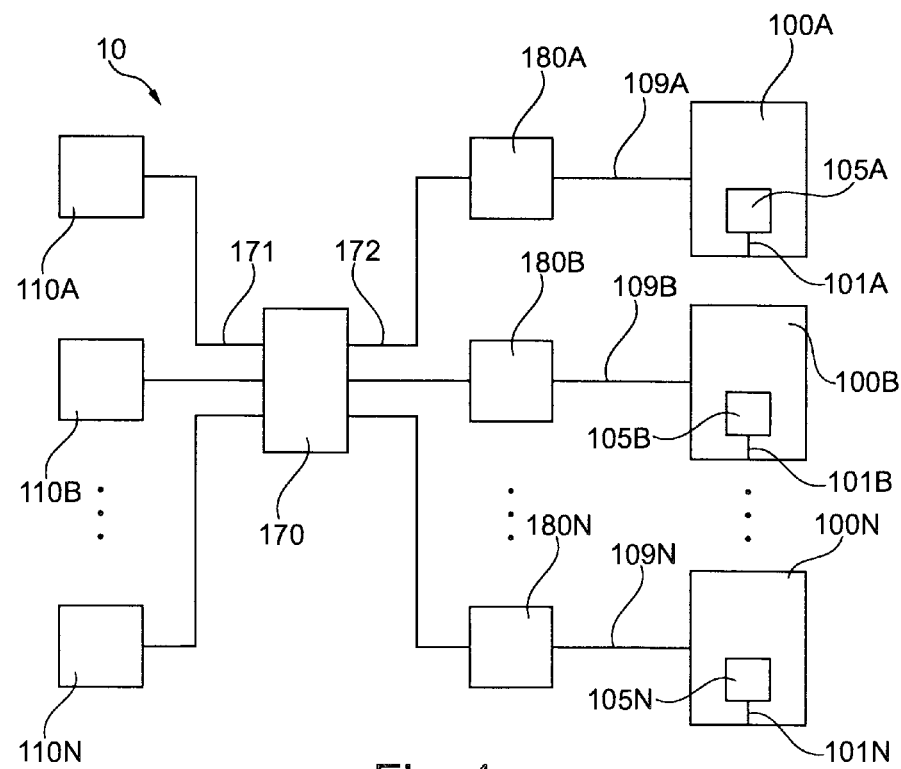
FIG. 4 is a schematic depiction of a test environment in accordance with another exemplary embodiment of the invention.

FIG. 4 is a schematic depiction of a test environment 10 having a plurality of test case implementation units 110A, 110B, 110N, and having a plurality of test object receiving devices 100A, 100B, 100N, each having a test object 105A, 105B, 105N, wherein each test object is connected via a receiving element 101A, 101B, 101N to the specific test object receiving device, and wherein each test object receiving device is connected to the connection unit 170 via an external connection interface 109A, 109B, 109N, each via a signal tap 180A, 180B, 180N.

Each test case implementation unit 110 is connected to the connection unit via an input interface 171 and each test object receiving device 100 is connected to the connection unit via an output interface 172. As already described above, the connection unit is embodied to connect each input interface to one or a plurality of output interfaces, wherein only one output interface at a time may be connected to an individual input interface.

The external interface 102E of the test signal interface unit 102 of the test object receiving device 100 may be coupled to the signal tap allocated to this test object receiving device so that test signals may be tapped via the signal tap 180A, 180B, 180N for diagnostic purposes.

For the sake of clarity, no simulation hardware unit was depicted in FIG. 4. It should therefore in particular be noted that, as depicted in FIG. 2, a plurality of test case implementation units 110, a plurality of test object receiving devices 100, and a plurality of simulation hardware units 150 may be connected to the connection unit 170. A test case implementation unit may be coupled via the connection unit to one or a plurality of test object receiving devices for implementing a test case. In addition, a test object receiving device or the test object contained therein may be coupled to a simulation hardware unit or a plurality of simulation hardware units via the connection unit.

In one exemplary embodiment, direct coupling of the test objects to one another is possible via the connection unit 170. Thus, in addition to a single test object, a combination of test objects interacting with one another may also be tested. Interaction between test objects means, for instance, a connection in which two or more test objects exchange data with one another, one test object requests data from another test object, or one test object causes actions in another test object or the outcome of an action is transmitted to another test object.

The connection unit also facilitates the coupling of test objects that are arranged spatially separated from one another into a common test scenario.

Thus, the test environment as described above and in the following enables simultaneous multiaccess to spatially distributed or non-distributed test objects starting from a test case implementation unit or by one user, temporally successive access to the same test object by a plurality of users or a plurality of test case implementation units, simultaneous access by a test object to a plurality of simulation hardware units that may be spatially distributed or non-distributed, and, finally, temporally successive access by a plurality of different test objects to the same simulation hardware unit. This permits resources-conserving use of the components of the test environment and, in particular, there is no need for a new, customized test environment to be designed and qualified for every test object.

The invention claimed is:

1. An arrangement for providing a test environment for testing test objects, comprising:
    a first test case implementation unit and a second test case implementation unit;
    a plurality of test objects, including a first test object and a second test object, each of which comprises an aircraft computer,
        wherein the test environment is configured such that at least the first test case implementation unit is coupled to at least one of the first test object and the second test object for implementing a test case;
    a connection unit that is configured to selectively couple one of the first test case implementation unit and the second test case implementation unit to at least one of the first test object and the second test object; and
    a plurality of mechanical simulation hardware units that are actuated by the plurality of test objects during a test case,
        wherein each of the plurality of simulation hardware units may be selectively coupled to one of the plurality of test objects via the connection unit,
        wherein the plurality of simulation hardware units are arranged spatially separated from the plurality of test objects.

2. The arrangement in accordance with claim 1, wherein the test environment is configured such that the first test case implementation unit is coupled to the first test object and also to the second test object for implementing one test case each.

3. The arrangement in accordance with claim 2, further having:
    a third test object;
    wherein the test environment is configured such that the second test case implementation unit is coupled to the third test object for implementing a test case.

4. The arrangement in accordance with claim 3,
wherein the connection unit has a plurality of input interfaces, each of which is configured to connect one of plurality of test case implementation units, which includes the first and second implementation units,
wherein the connection unit further has a plurality of output interfaces, each of which is configured to connect one of the plurality of test objects, which includes the first and second test objects, and
wherein the connection unit is configured to couple one of the plurality of input interfaces to at least two of the plurality of output interfaces so that one of the plurality of test case implementation units is coupled to at least two of the plurality of test objects allocated to said at least two of the plurality of output interfaces.

5. The arrangement in accordance claim 2, further having:
a plurality of signal taps, each of which is allocated to one of the plurality of test objects and is configured to read out data transmitted to the one of the plurality of test objects and output by the one of the plurality of test objects.

6. The arrangement in accordance with claim 5,
wherein at least one signal tap is configured to receive data that can be forwarded as an input signal to the one of the plurality of test objects allocated to such at least one signal tap.

7. The arrangement in accordance with claim 5, further having:
a control device that is configured to control the coupling of the plurality of test case implementation units to the plurality of test objects, and to control the coupling of the plurality of test objects to the plurality of simulation hardware units via the connection unit.

8. The arrangement in accordance with claim 1, further having:
a third test object;
wherein the test environment is configured such that the second test case implementation unit is coupled to the third test object for implementing a test case.

9. The arrangement in accordance with claim 1, further comprising:
a connection bus that is configured to connect a plurality of test case implementation units, which includes the first and second implementation units, to the plurality of test objects, which includes the first and second test objects, such that each of the plurality of test case implementation units may be selectively coupled to each of the plurality of test objects.

10. The arrangement in accordance claim 9, further having:
a plurality of signal taps, each of which is allocated to one of the plurality of test objects and is configured to read out data transmitted to the one of the plurality of test objects and output by the one of the plurality of test objects.

11. The arrangement in accordance with claim 10,
wherein at least one signal tap is configured to receive data that can be forwarded as an input signal to the one of the plurality of test objects allocated to such at least one signal tap.

12. The arrangement in accordance with claim 9, further having:
a control device that is configured to control the coupling of the plurality of test case implementation units to the plurality of test objects, and to control the coupling of the plurality of test objects to the plurality of simulation hardware units via the connection unit.

13. The arrangement in accordance claim 1, further having:
a plurality of signal taps, each of which is allocated to one of the plurality of test objects, which includes the first and second test objects, and is configured to read out data transmitted to the one of the plurality of test objects and output by the one of the plurality of test objects.

* * * * *